US012677537B2

(12) United States Patent
Lv et al.

(10) Patent No.: US 12,677,537 B2
(45) Date of Patent: Jul. 7, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventors: Lei Lv, Wuhan (CN); Meng Jin, Wuhan (CN); Lin Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 42 days.

(21) Appl. No.: 17/642,964

(22) PCT Filed: Feb. 7, 2022

(86) PCT No.: PCT/CN2022/075332
§ 371 (c)(1),
(2) Date: Aug. 3, 2023

(87) PCT Pub. No.: WO2023/142155
PCT Pub. Date: Aug. 3, 2023

(65) Prior Publication Data
US 2024/0057380 A1 Feb. 15, 2024

(30) Foreign Application Priority Data
Jan. 25, 2022 (CN) .......................... 202210088411.5

(51) Int. Cl.
*H10K 59/126* (2023.01)
*H10K 59/121* (2023.01)
(Continued)

(52) U.S. Cl.
CPC ......... *H10K 59/121* (2023.02); *H10K 59/131* (2023.02); *H10K 59/353* (2023.02); *H10K 59/65* (2023.02); *H10K 59/8792* (2023.02)

(58) Field of Classification Search
CPC .. H10K 59/121; H10K 59/131; H10K 59/353; H10K 59/65; H10K 59/8792; H10K 59/126; H10K 59/1213; H10K 59/8052
See application file for complete search history.

(56) References Cited

U.S. PATENT DOCUMENTS

2021/0408194 A1 * 12/2021 Zhang .................. H10K 59/126

FOREIGN PATENT DOCUMENTS

CN 110444125 A * 11/2019 .......... G09G 3/3208
CN 110767729 A 2/2020
(Continued)

OTHER PUBLICATIONS

English Machine Translation of Yan et al CN 110444125 (Year: 2025).*

(Continued)

*Primary Examiner* — Donald L Raleigh
(74) *Attorney, Agent, or Firm* — Nathan & Associates; Menachem Nathan

(57) ABSTRACT

A display panel and a display device are disclosed in the present disclosure. A minimum spacing between adjacent two second pixel repetition units is greater than a minimum spacing between adjacent two first pixel repetition units. Each one of at least portion of the second pixel repetition units is disposed corresponding to one of the first light-shielding blocks, and one of the first light-shielding block at least partially overlapped with the corresponding second pixel repetition unit, so that the patterning of the cathode layer in the second display area is realized by using a plurality of first light-shielding blocks.

16 Claims, 5 Drawing Sheets

(51) Int. Cl.

| | | |
|---|---|---|
| *H10K 59/131* | (2023.01) | |
| *H10K 59/35* | (2023.01) | |
| *H10K 59/65* | (2023.01) | |
| *H10K 59/80* | (2023.01) | |

(56) References Cited

FOREIGN PATENT DOCUMENTS

| CN | 111627341 | A | 9/2020 |
|---|---|---|---|
| CN | 111708230 | A | 9/2020 |
| CN | 112102783 | A | 12/2020 |
| CN | 112864217 | A | 5/2021 |
| CN | 113284911 | A | 8/2021 |
| CN | 113299859 | A | 8/2021 |
| CN | 113594210 | A | 11/2021 |
| CN | 113675249 | A | 11/2021 |
| CN | 113871420 | A | 12/2021 |
| JP | 2019133868 | A | 8/2019 |
| WO | 2021016821 | A1 | 2/2021 |

OTHER PUBLICATIONS

Chinese Office Action issued in corresponding Chinese Patent Application No. 202210088411.5 dated Apr. 25, 2024, pp. 1-10.
International Search Report in International application No. PCT/CN2022/075332,mailed on Oct. 20, 2022.
Written Opinion of the International Search Authority in International application No. PCT/CN2022/075332,mailed on Oct. 20, 2022.

* cited by examiner

100

10c   10b

10

10d

10a

100

10d     10a          10c  10b 10c   10a     10d

10

20 second direction first direction (A)                                          (B)

DISPLAY PANEL AND DISPLAY DEVICE

FIELD OF INVENTION

The present disclosure relates to the field of display technology, and more particularly, to a display panel and a display device.

BACKGROUND OF INVENTION

In the design of an active organic light-emitting diode display panel, how to realize full screen display and under-screen camera for the active organic light-emitting diode display panel has been a difficult problem, wherein the main problem is how to improve the light transmittance of a photosensitive area. At present, a conventional design is to punch a hole for the photosensitive area, and the panel may have relatively high transmittance in the photosensitive area in this way. However, it does not emit lights and display in the photosensitive area, and thus the full screen display cannot be realized, which results in a poor user experience. In recent years, another method is provided to lower the pixel density of the photosensitive area to improve the light transmittance, while the normal illumination and display in the photosensitive area are ensured, which results in a relatively good user experience. However, the overall transmittance is still low in this way.

Therefore, how to improve the light transmittance of the photosensitive area is still a problem to be solved.

SUMMARY OF INVENTION

Technical Problem

The objective of the present disclosure is to provide a display panel which facilitates the improvement of a light transmittance of a second display area in the display panel.

Technical Solutions

A display panel has a first display area and a second display area, wherein the display panel includes:

a substrate;

a light-emitting layer located on one side of the substrate, wherein the light-emitting layer includes:

a plurality of first pixel repetition units located in the first display area, wherein one of the first pixel repetition units includes a plurality of first sub-pixels; and a plurality of second pixel repetition units located in the second display area, wherein one of the second pixel repetition units includes a plurality of second sub-pixels, wherein the number of second sub-pixels in one of the second pixel repetition units is equal to the number of first sub-pixels in one of the first pixel repetition units, and a minimum spacing between adjacent two of the second pixel repetition units is greater than a minimum spacing between adjacent two of the first pixel repetition units; and a metallic light-shielding layer disposed between the light-emitting layer and the substrate, wherein the metallic light-shielding layer includes:

a plurality of first light-shielding blocks located in the second display area, wherein the first light-shielding blocks are at least partially overlapped with the second pixel repetition units, respectively.

A display device includes the aforementioned display panel and a photosensitive component, wherein the photosensitive component is disposed corresponding to the second display area.

Beneficial Effects

A display panel and a display device are disclosed in the present disclosure. By designing the minimum spacing between adjacent two of the second pixel repetition units being greater than the minimum spacing between adjacent two of the first pixel repetition units, the light-transmitting openings of cathodes in the second display area may be largened, such that an area ratio of the cathodes to the second display area is reduced, which facilitating the improvement of the light transmittance of the second display area. Moreover, on the basis of the minimum spacing between adjacent two of the second pixel repetition units which is greater than the minimum spacing between adjacent two of the first pixel repetition units, each one of at least portion of the second pixel repetition units is disposed corresponding to one of the first light-shielding blocks, and one of the first light-shielding block at least partially overlapped with the corresponding second pixel repetition unit, so that the patterning of the cathode layer in the second display area is realized by using a plurality of first light-shielding blocks and one first light-shielding block also functions as protection for a plurality of second sub-pixels of a second pixel repetition unit.

DETAILED DESCRIPTION OF PREFERRED EMBODIMENTS

The technical solutions in the embodiments of the present disclosure are clearly and completely described below in combination with the accompanying drawings in the embodiments of the present disclosure. Obviously, the described embodiments are only a part of the embodiments of the present disclosure rather than all of the embodiments. Based on the embodiments in the present disclosure, all other embodiments obtained by a person of ordinary skill in the art without creative efforts fall within the claim scope of the present disclosure.

Figures 1, 2:
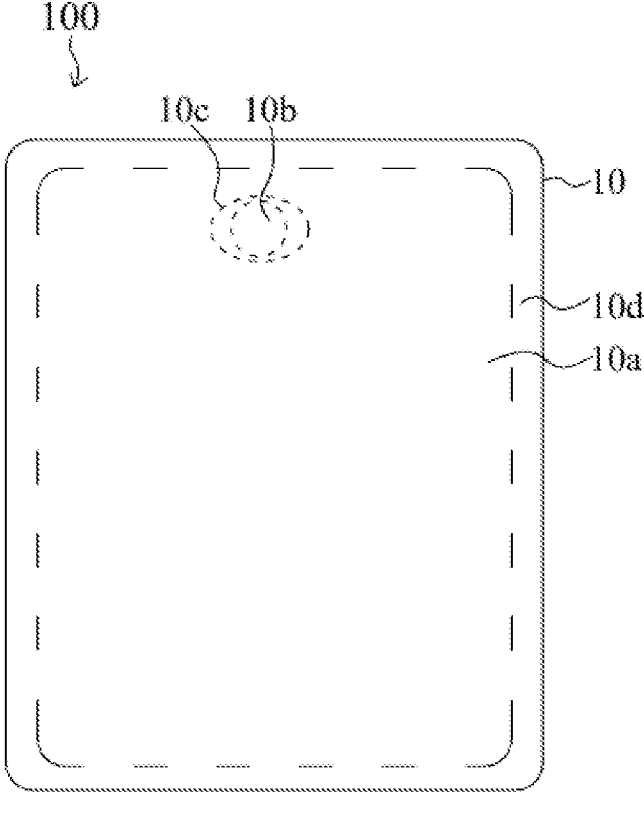
FIG. 1 is a schematic plan view of a display device according to an embodiment of the present disclosure.
FIG. 2 is a schematic cross-sectional view of a display device according to an embodiment of the present disclosure.

As shown in FIG. 1 and FIG. 2, the present disclosure provides a display device 100. The display device 100 includes a display panel 10 and a photosensitive component 20. The display panel 10 is an organic light-emitting diode display panel, and the photosensitive component 20 is a camera, an infrared sensor, and so on.

The display panel 10 has a first display area 10a, a second display area 10b, a transition display area 10c, and a non-display area 10d. The first display area 10a is located in a periphery of the second display area 10b, the transition display area 10c is located between the first display area 10a and the second display area 10b, and the non-display area 10d is located in a periphery of the first display area 10a. The first display area 10a, the second display area 10b, and the transition display area 10c are configured for display, and the non-display area 10d is not configured for display. The second display area 10b is also configured for light transmission. The light transmittance of the second display area 10b is greater than the light transmittances of the first display area 10a and the transition display area 10c. The photosensitive component 20 is located on the back of the light-emitting surface of the display panel 10 and is disposed corresponding to the second display area 10b of the display panel 10.

The area of the first display area 10a is larger than the area of the second display area 10b and the area of the transition display area 10c. The shape of the second display area 10b is circular, and the shape of the transition display area 10c is annular. It can be understood that the shape of the second display area 10b can also be elliptical, square, or rectangular.

Figure 3:
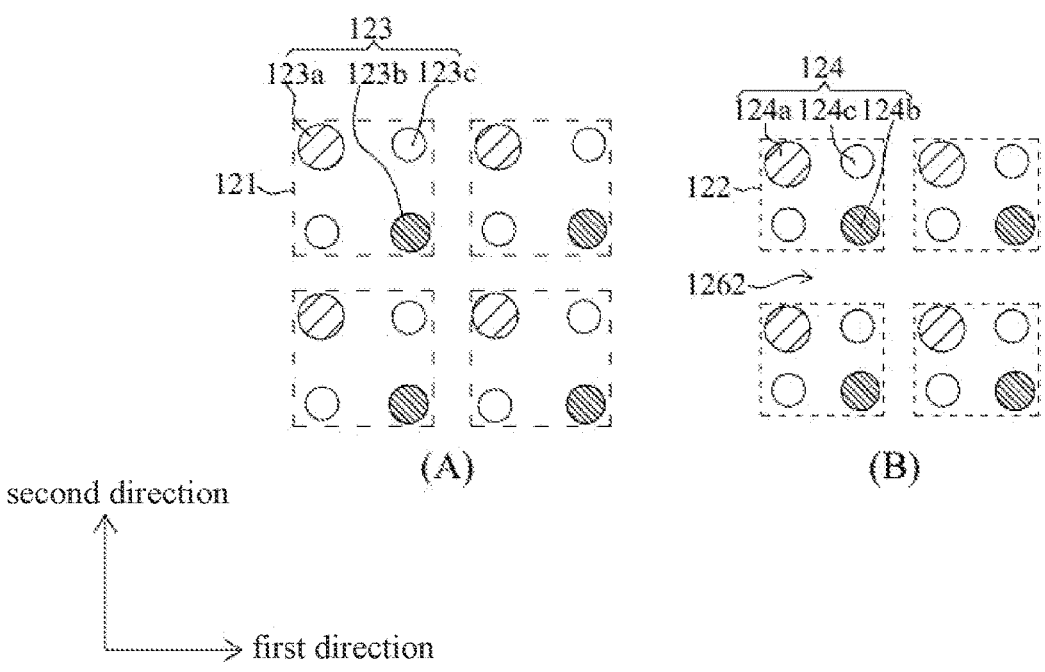
FIG. 3 is a first plan view of the first pixel repetition units in the first display area and the second pixel repetition units in the second display area of the display panel shown in FIG. 2.
Figure 4:
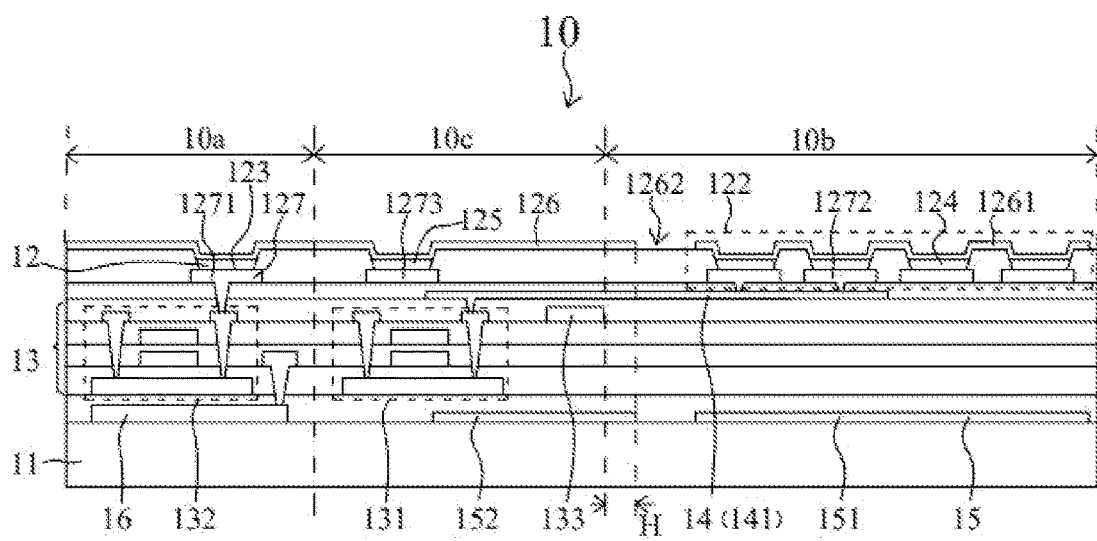
FIG. 4 is a schematic cross-sectional view of the display panel shown in FIG. 2.

As shown in FIG. 3 and FIG. 4, FIG. 3 (A) shows a schematic diagram of a plurality of first pixel repetition units located in the first display area, and FIG. 3 (B) shows is a schematic diagram of a plurality of second pixel repetition units located in the second display area. FIG. 4 is a schematic cross-sectional view of the display panel shown in FIG. 2. The display panel 10 includes a substrate 11 and a light-emitting layer 12 which is located on one side of the substrate 11. The light-emitting layer 12 includes a plurality of first pixel repetition units 121 located in the first display area 10a and a plurality of second pixel repetition units 122 located in the second display area 10b. The first pixel repetition unit 121 is arranged as a repetition unit in the first display area 10a in an array manner, and the second pixel repetition unit 122 is arranged is arranged as a repetition unit in the second display area 10b in an array manner. The manufacturing material of the light-emitting layer 12 is an organic light-emitting material.

Moreover, one of the first pixel repetition units 121 includes a plurality of first sub-pixels 123, and one of the second pixel repetition units 122 includes a plurality of second sub-pixels 124. The number of second sub-pixels 124 in a second pixel repetition unit 122 is the same as the number of first sub-pixels 123 in a first pixel repetition unit 121. The arrangement of the first sub-pixels 123 in a first pixel repetition unit 121 is the same as the arrangement of the second sub-pixels 124 in a second pixel repetition unit 122. The distribution density of the second pixel repetition units 122 in the second display area 10b is the same as the distribution density of the first pixel repetition units 121 in an area with the same shape and area as the second display area 10b in the first display area 10a. The distribution density of the second sub-pixels 124 in the second display area 10b is the same as the distribution density of the first sub-pixels 123 in an area with the same shape and area as the second display area 10b in the first display area 10a.

It should be noted that the distribution density is the ratio of the number to the area. For example, the distribution density of the second pixel repetition units 122 in the second display area 10b refers to the ratio of the number of second pixel repetition units 122 in the second display area 10b to the area of the second display area 10b.

The light-emitting layer 12 further includes a plurality of third sub-pixels 125 located in the transition display area 10c. The shape, size and arrangement of the third sub-pixels 125 in the transition display area 10c may be the same as those of the first sub-pixels 123 in the first display area 10a.

As shown in FIG. 3, the spacing between adjacent two of the first sub-pixels 123 in one of the first pixel repetition units 121 is greater than the spacing between adjacent two of the second sub-pixels 124 in one of the second pixel repetition units 122, so that the second sub-pixels 124 in the second pixel repetition unit 122 are gathered round with respect to the first sub-pixels 123 in the first pixel repetition unit 121. The area occupied by the second sub-pixels 124 of one of the second pixel repetition units 122 in the second display area 10b is reduced. Moreover, in the condition that the distribution density of the second pixel repetition units 122 in the second display area 10b is the same as the distribution density of the first pixel repetition units 121 in the area with the same shape and area as the second display area 10b in the first display area 10a, the minimum spacing between adjacent two of the second pixel repetition units 122 is greater than the minimum spacing between adjacent two of the first pixel repetition units 121. The area of the light-transmitting opening 1262 defined between the adjacent two of the second pixel repetition units 122 may be largened, and the area of the light-transmitting opening 1262 defined between t the second pixel repetition units 122 and the transition display area 10c may also be largened, which is advantageous to reducing the area ratio of the second electrode layer 126 to the second display area 10b, thereby improving the light transmittance of the second to display area 10b, which facilitates the enhancement of the photo-sensitivity of the photosensitive component 20.

It should be noted that the minimum spacing between the adjacent two of the second pixel repetition units 122 refers to the minimum spacing between the edges of the two nearest second sub-pixels 124 which are located in the adjacent two of the second pixel repetition units 122, respectively. The minimum spacing between the adjacent two of the first pixel repetition units 121 refers to the minimum spacing between the edges of the two nearest first sub-pixels 123 which are located in the adjacent two of the first pixel repetition units 121, respectively.

Reference is made to FIG. 3. The first sub-pixels 123 in the first pixel repetition unit 121 include a first light-emitting unit 123a that emits a first color light, a second light-emitting unit 123b that emits a second color light, and a third light-emitting unit 123c that emits a third color light. The colors of the first color light, the second color light, and the third color light are different from each other. In one of the first pixel repetition units 121, the ratio of the number of first light-emitting units 123a, the number of second light-emitting units 123b, and the number of third light-emitting units 123c is 1:1:2. The shapes of first sub-pixels 123 include but not limited to circles, prisms, rectangles, and ellipses.

The second sub-pixels 124 in the second pixel repetition unit 122 include a fourth light-emitting unit 124*a* emitting the first color light, a fifth light-emitting unit 124*b* emitting the second color light, and a sixth light-emitting unit 124*c* emitting the third color light. In one of the second pixel repetition units 122, the ratio of the number of fourth light-emitting units 124*a*, the number of fifth light-emitting units 124*b*, and the number of sixth light-emitting units 124*c* is 1:1:2. The shapes of the second sub-pixels 124 include but not limited to circles, prisms, rectangles, and ellipses.

Moreover, the shape and size of the first light-emitting unit 123*a* may be equal to or different from those of the fourth light-emitting unit 124*a*. The shape and size of the second light-emitting unit 123*b* may be equal to or different from those of the fifth light-emitting unit 124*b*. The shape and size of the third light-emitting unit 123*c* may be equal to or different from those of the sixth light-emitting unit 124*c*.

Specifically, the shape and size of the first light-emitting unit 123*a* are equal to those of the fourth light-emitting unit 124*a*, wherein the shapes of the first light-emitting unit 123*a* and the fourth light-emitting unit 124*a* are both circular, and the color of the first color light is blue. The shape and size of the second light-emitting unit 123*b* are also equal to those of the fifth light-emitting unit 124*b*, wherein the shapes of the second light-emitting unit 123*b* and the fifth light-emitting unit 124*b* are both circular, and the color of the second color light is red. The shape and size of the third light-emitting unit 123*c* are also equal to those of the sixth light-emitting unit 124*c*, wherein the shapes of the third light-emitting unit 123*c* and the sixth light-emitting unit 124*c* are both circular, and the color of the third color light is green.

In one of the first pixel repetition units 121, one first light-emitting unit 123*a*, two third light-emitting units 123*c*, and one second light-emitting unit 123*b* are arranged in a square. One first light-emitting unit 123*a* is arranged adjacent to one third light-emitting unit 123*c* in the first direction and adjacent to another third light-emitting unit 123*c* in the second direction. One second light-emitting unit 123*b* is arranged adjacent to one third light-emitting unit 123*c* in the first direction and adjacent to another third light-emitting unit 123*c* in the second direction. The two third light-emitting units 123*c* are arranged diagonally, and the first light-emitting unit 123*a* and the second light-emitting unit 123*b* are also arranged diagonally. The spacing between the center of the first light-emitting unit 123*a* and the center of one third light-emitting unit 123*c* is equal to the spacing between the center of the first light-emitting unit 123*a* and the center of another third light-emitting unit 123*c*. The first direction is perpendicular to the second direction.

In one of the second pixel repetition units 122, one fourth light-emitting unit 124*a*, two sixth light-emitting units 124*c*, and one fifth light-emitting unit 124*b* are arranged in a square. One fourth light-emitting unit 124*a* is arranged adjacent to one sixth light-emitting unit 124*c* in the first direction and adjacent to another sixth light-emitting unit 124*c* in the second direction. One fifth light-emitting unit 124*b* is arranged adjacent to one sixth light-emitting unit 124*c* in the first direction and adjacent to another sixth light-emitting unit 124*c* in the second direction. The two sixth light-emitting units 124*c* are arranged diagonally, and the fourth light-emitting unit 124*a* and the fifth light-emitting unit 124*b* are arranged diagonally. Moreover, the spacing between the center of the fourth light-emitting unit 124*a* and the center of one sixth light-emitting unit 124*c* is equal to the spacing between the center of the fourth light-emitting unit 124*a* and the center of another sixth light-emitting unit 124*c*. The spacing between the center of the fourth light-emitting unit 124*a* and the center of one sixth light-emitting unit 124*c* is smaller than the spacing between the center of the first light-emitting unit 123*a* and the center of one third light-emitting unit 123*c*.

Figure 6:
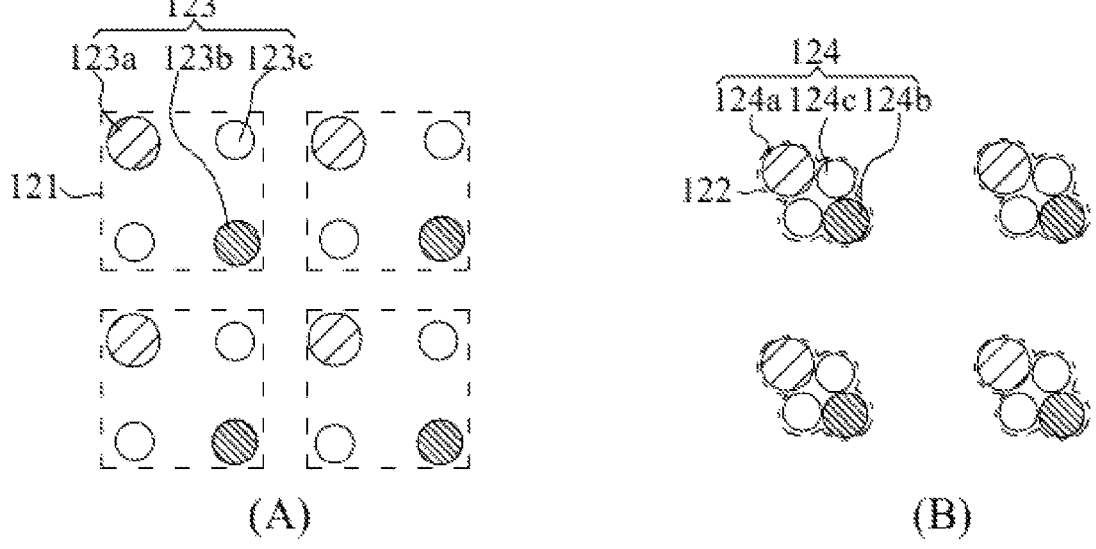
FIG. 6 is a second plan view of the first pixel repetition units in the first display area and the second pixel repetition units in the second display area of the display panel shown in FIG. 2.

It should be noted that the arrangement manner of the first sub-pixels 123 in one of the first pixel repetition units 121 may be different from the arrangement manner of the second sub-pixels 124 in one of the second pixel repetition units 122. As shown in FIG. 6, FIG. 6 (A) shows a schematic diagram of the first pixel repetition units located in the first display area, and FIG. 6 (B) shows a schematic diagram of the second pixel repetition units located in the second display area. FIG. 6 (A) is exactly the same as FIG. 3 (A). FIG. 6 (B) is basically similar to FIG. 3 (B), in which the difference is that the second sub-pixels 124 in one of the second pixel repetition units 122 are arranged irregularly.

As shown in FIG. 4, the display panel 10 includes a first electrode layer 127 and a second electrode layer 126. The first electrode layer 127 is located between the light-emitting layer 12 and the substrate 11, and the second electrode layer 126 is disposed on the side of the light-emitting layer 12 away from the substrate 11. Moreover, the first electrode layer 127 includes a first transparent conductive layer, a metal layer, and a second transparent conductive layer which are stacked in order. The manufacturing material of the metal layer includes but not limited to silver. The manufacturing material of the second electrode layer 126 includes a magnesium silver alloy. Both the first electrode layer 127 and the second electrode layer 126 include a metal, but the metal may reduce the light transmittance.

The first electrode layer 127 includes a plurality of first anodes 1271, a plurality of second anodes 1272, and a plurality of third anodes 1273. In a thickness direction of the display panel 10, the first anodes 1271, which are spaced apart with each other, are overlapped with the first sub-pixels 123 of one of the first pixel repetition units 121, respectively, and one of the first anodes 1271 is overlapped with one of the first sub pixels 123 correspondingly. In the thickness direction of the display panel 10, the second anodes 1272, which are spaced apart with each other, are overlapped with the second sub-pixels 124 of one of the second pixel repetition units 122, respectively, and one of the second anodes 1272 is overlapped with one of the second sub-pixels 124 correspondingly. In the thickness direction of the display panel 10, one of the third anodes 1273 is overlapped with one third sub-pixel 125.

Figure 7:
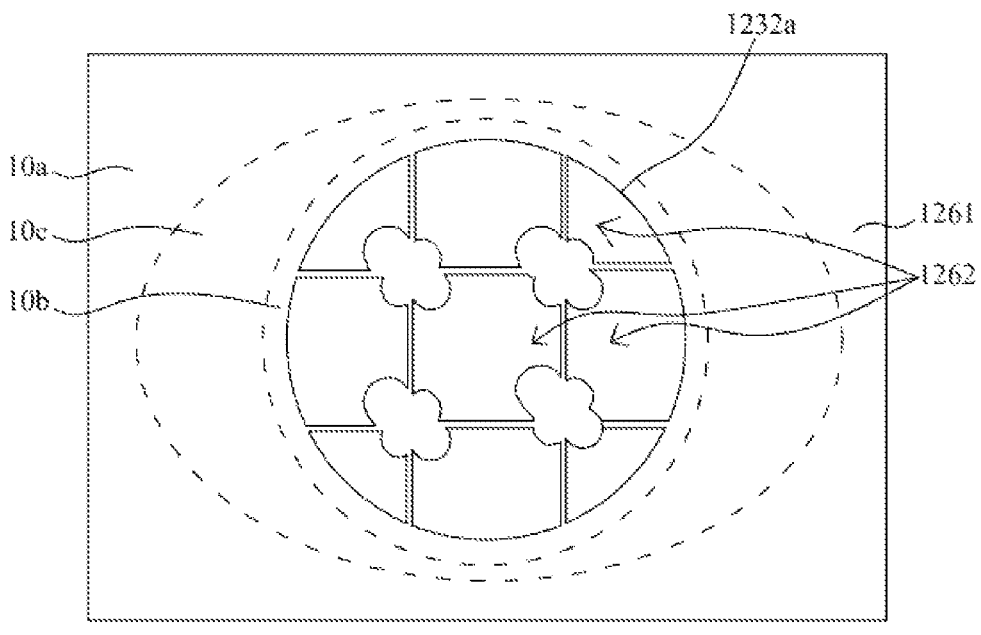
FIG. 7 is a schematic plan view of a second electrode layer in the display panel shown in FIG. 4.

In order to improve the light transmittance of the second display area 10*b*, the second electrode layer 126 needs to be patterned in the second display area 10*b*. As shown in FIG. 4 and FIG. 7, the second electrode layer 126 includes a patterned cathode 1261 and a plurality of light-transmitting openings 1262 distributed in the patterned cathode 1261.

The patterned cathode 1261 is disposed in the first display area 10*a*, the second display area 10*b*, and the transition display area 10*c*. The portions of the patterned cathode 1261 located in both the first display area 10*a* and the transition display area 10*c* are unbroken. A plurality of light-transmitting openings 1262 are distributed in the portion of the patterned cathode 1261 located in the second display area 10*b*, wherein a part of the light-transmitting openings 1262 are located between adjacent two of the second pixel repetition units 122, and a part of the light-transmitting openings 1262 are located between the second pixel repetition units 122 and the transition display area 10*c*. The light-transmitting openings 1262 are provided to improve the light transmittance of the second display area 10*b*.

In this embodiment, as shown in FIG. 4, the display panel 10 further includes a pixel circuit layer 13 and a transparent wire layer 14, and the transparent wire layer 14 is located between the pixel circuit layer 13 and the first electrode layer 127 in the thickness direction of the display panel 10.

The pixel circuit layer 13 includes a plurality of first pixel circuits 131, a plurality of second pixel circuits 132, and a plurality of metal lines 133. The first pixel circuit 131 and the second pixel circuit 132 may be the same or different. Each of the first pixel circuit 131 and the second pixel circuit 132 is selected from one of a 7T1C circuit, a 6T1C circuit, a 6T2C circuit, a 5T1C circuit, a 4T1C circuit, a 3T1C circuit, and a 2T1C circuit.

Figure 8:
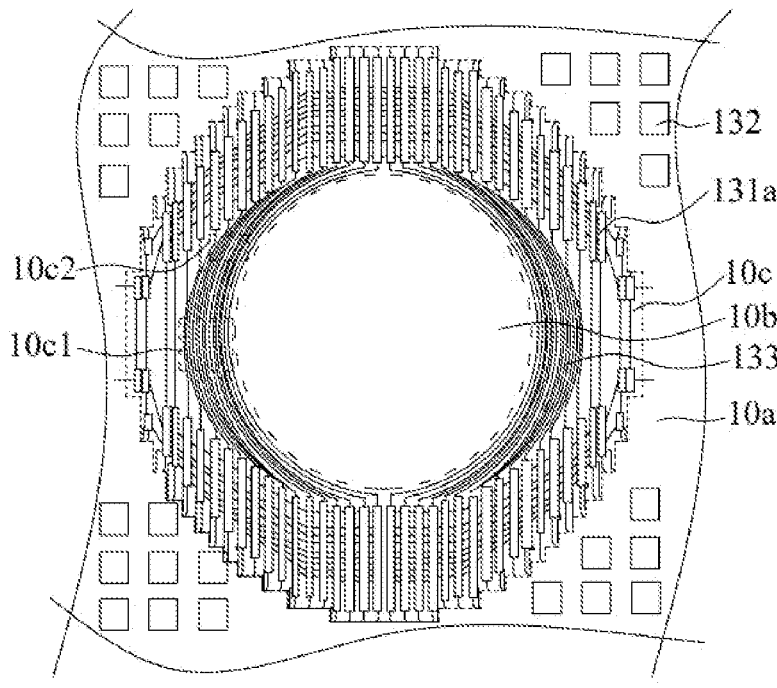
FIG. 8 is a partially enlarged schematic view of the display panel shown in FIG. 2.

As shown in FIG. 4 and FIG. 8, the first pixel circuits 131 are located in the transition display area 10*c*. In the transition display area 10*c*, the first pixel circuits 131 are gathered round to form a plurality of pixel-driving circuit islands 131*a*, and each of the pixel-driving circuit island 131*a* includes at least two of the first pixel circuits 131.

The second sub-pixels 124 in the second display area 10*b* are electrically connected with the first pixel circuits 131, and each of the first pixel circuits 131 electrically connected with the second sub-pixels 124 is electrically connected with at least two of the second sub-pixels 124. Specifically, each of the first pixel circuits 131 electrically connected with the second sub-pixels 124 is electrically connected with at least two of the second sub-pixels 124 emitting the same color light. For example, one of the first pixel circuits 131 is electrically connected with two fourth light-emitting units 124*a* in two of the second pixel repetition units 122, one of the first pixel circuits 131 is electrically connected with four sixth light-emitting units 124*c* in two of the second pixel repetition units 122, and one of the first pixel circuits 131 is electrically connected with two fifth light-emitting units 124*b* in two of the second pixel repetition units 122.

The transparent wire layer 14 includes a plurality of transparent wires 141, wherein one portion of the transparent wires 141 is located in the second display area 10*b*, and another portion of the transparent wires 141 extends from the transition display area 10*c* to the second display area 10*b*. The transparent wires 141 can be arranged in one layer or in multiple layers. When the transparent wires 141 are arranged in multiple layers, an insulating layer is disposed between the transparent wires 141 located between different layers. The manufacturing material of the transparent wires 141 is at least one of indium tin oxide or indium zinc oxide.

Moreover, one end of at least one of the transparent wires 141 of at least part of the transparent wires 141 located in the second display area 10*b* is electrically connected with at least two second sub-pixels 124 emitting the same color light in two of the second pixel repetition units 122, and the other end of the at least one of the transparent wires 141 is electrically connected with one of the first pixel circuits 131, such that the light transmittance of the second display area 10*b* is improved in the condition that the transparent wire 141 is electrically connected with one of the first pixel circuits 131 and at least two second sub-pixels 124 emitting the same color light in two of the second pixel repetition units 122.

In this embodiment, at least part of the transparent wires 141 located in the second display area 10*b* is serpentine to suppress the occurrence of the diffraction phenomenon while the light passes through the second display area 10*b*, so as to improve the display effect of the display in the second display area 10*b*. The serpentine is non-linear, including broken line shape, arc curve shape, and so on.

Figure 5:
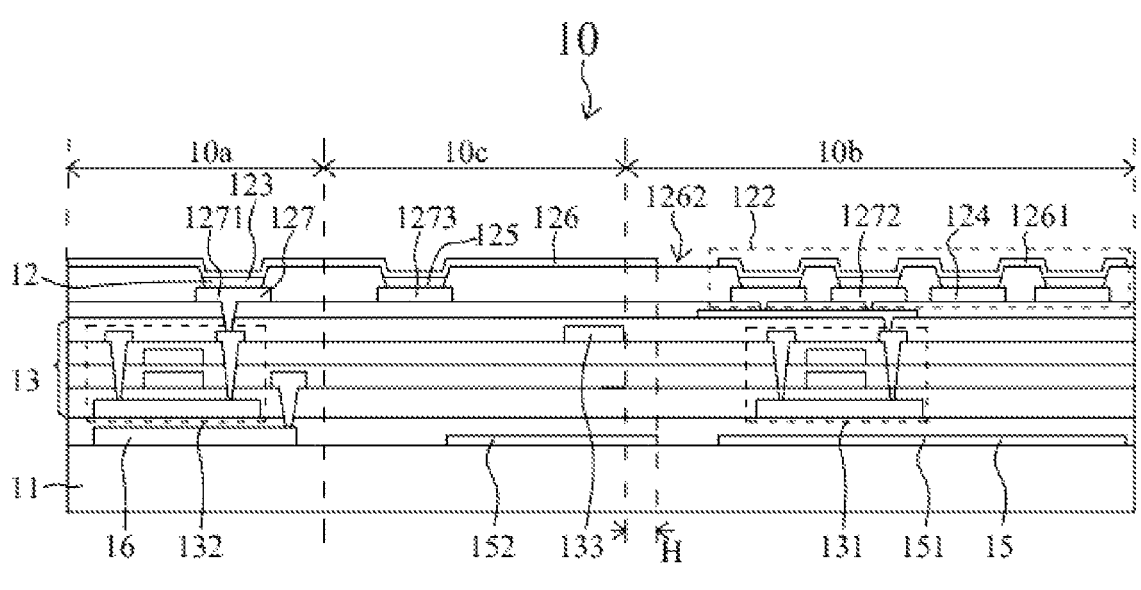
FIG. 5 is a schematic cross-sectional view of a display panel of a display device according to another embodiment of the present disclosure.

As shown in FIG. 5, the first pixel circuits 131 may also be disposed in the second display area 10*b*, and the first pixel circuits 131 are electrically connected with the second sub-pixels 124.

As shown in FIG. 4 and FIG. 5, the second pixel circuits 132 are located in the first display area 10*a* and disposed between the light-emitting layer 12 and the substrate 11. The second pixel circuits 132 are electrically connected with the first sub-pixels 123 of the first pixel repetition units 121 to drive the first sub-pixels 123 to emit light. Moreover, one of the second pixel circuits 132 is electrically connected with one of the first sub-pixels 123.

The metal lines 133 are located in the transition display area 10*c* and arranged close to the second display area 10*b*. The metal lines 133 are arranged around the second display area 10*b*, and the metal lines 133 are electrically connected with the first pixel circuits 131. The metal lines 133 are data lines. The outer contour of the metal lines 133 close to the second display area 10*b* are an interface between the transition display area 10*c* and the second display area 10*b*.

As shown in FIG. 8, the transition display area 10*c* includes a first wiring area 10*c*1 close to the second display area 10*b* and a second wiring area 10*c*2 close to the second display area 10*b*. The first wiring area 10*c*1 is located outside the second wiring area 10*c*2. In the direction of the second display area 10*b* toward the transition display area 10*c*, the area occupied by the metal lines 133 in the first wiring area 10*c*1 is larger than the area occupied by the metal lines 133 in the second wiring area 10*c*2.

The patterning design of the second electrode layer 126 in the second display area 10*b* is to irradiate the infrared laser onto a part of the second electrode layer 126 in the second display area 10*b* from the back of the display panel 10 (i.e., below the substrate of the display panel 10). The part of the second electrode layer 126 in the second display area 10*b* absorbs the infrared laser, while the organic layer, the inorganic insulating layer in the display panel have almost no absorption of infrared laser. The temperature of said part of the second electrode layer 126 increases by thermal relaxation and heat transfer to result in the variations such as melting and gasification, such that said part of the second electrode layer 126 peels off, thereby realizing the patterning of the second electrode layer 126 in the second display area 10*b*.

In order to obtain the patterned cathode 1261 and a plurality of light-transmitting openings 1262 distributed in the patterned cathode 1261 by irradiating the infrared laser on the whole surface of the second electrode layer 126, a metallic light-shielding layer is provided between the light-emitting layer 12 and the substrate 11 of the display panel 10 to block a part of the infrared laser in the present disclosure. When the second display area 10*b* is irradiated by the infrared laser, a part of the cathode, which is not blocked by the metallic light-shielding layer, is irradiated by the infrared laser, in which said part of the cathode is removed to form a plurality of light-transmitting openings 1262, thereby realizing the patterning of the second electrode layer 126.

Figure 9:
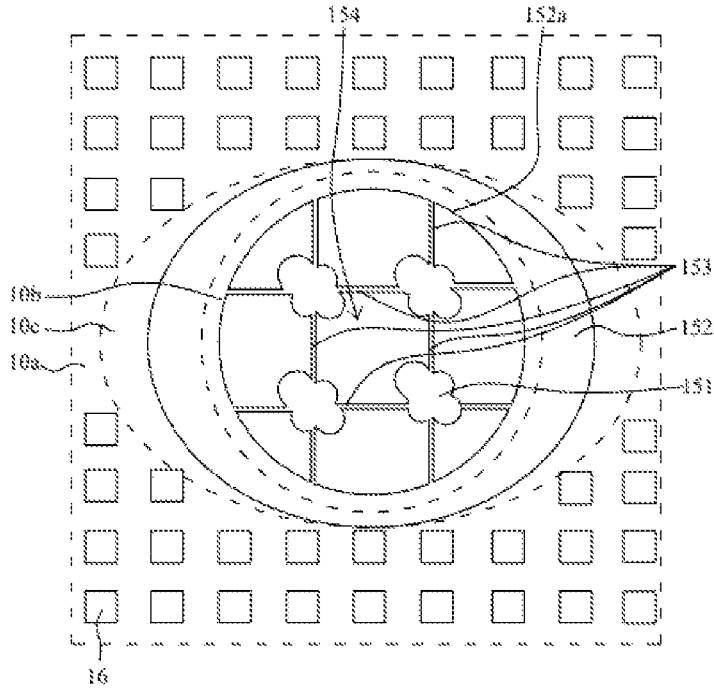
FIG. 9 is a first plan view of a metallic light-shielding layer and a plurality of shielding metal blocks of the display panel shown in FIG. 2.

As shown in FIG. 4 and FIG. 9, the metallic light-shielding layer 15 is disposed between the light-emitting layer 12 and the substrate 11 in the thickness direction of the display panel 10, and the metallic light-shielding layer 15 is disposed between the pixel circuit layer 13 and the substrate 11. The metallic light-shielding layer 15 includes a plurality of first light-shielding blocks 151, a second light-shielding block 152, and a plurality of light-shielding connecting lines 153. The thickness of the metallic light-shielding layer 15 ranges from 500 angstroms to 5000 angstroms, such as 1000 angstroms, 1500 angstroms, 2000 angstroms, or 3000 angstroms. The manufacturing material of the metallic light-shielding layer 15 is selected from at least one of molybdenum, aluminum, titanium, lithium, tungsten, copper, and silver.

As shown in FIG. 4, the first light-shielding blocks 151 are located in the second display area 10b and overlapped with the patterned cathode 1261, each of the second pixel repetition units 122 of at least part of the second pixel repetition units 122 is disposed corresponding to one of the first light-shielding block 151. Each of the first light-shielding blocks 151 overlaps at least part of the corresponding second pixel repetition unit 122, such that the infrared laser is blocked by one of the first light-shielding blocks 151 to protect the second sub-pixels 124 of each of the second pixel repetition units 122 of at least part of the second pixel repetition units 122. Specifically, each of the second pixel repetition units 122 is overlapped with one of the first light-shielding blocks 151 correspondingly, and the outer contour of each of the second pixel repetition units 122 is the same or tends to be the same as the outer contour of the corresponding first light-shielding block 151.

In the present disclosure, the second sub-pixels 124 of each of the second pixel repetition units 122 in the second display area 10b are designed to be aggregated, so as to reduce the area of the cathode shared by the second sub-pixels 124 of each of the second pixel repetition units 122. In addition, the areas of the light-transmitting openings 1262 between adjacent two of the second pixel repetition units 122 are enhanced, so as to improve the light transmittance of the second display area 10b. On the basis of the aggregation design of the second sub-pixels 124 of each of the second pixel repetition units 122, one of the first light-shielding block 151 is disposed corresponding to one of the second pixel repetition units 122, such that the components of each of the second pixel repetition units 122 is prevented from damaging by the infrared laser while the second electrode layer 126 in the second display area 10b is patterned to obtain the patterned cathode 1261.

In this embodiment, the second anodes 1272, which are overlapped with the second sub-pixels 124 of one of the second pixel repetition units 122 correspondingly, are overlapped with one of the first light-shielding blocks 151, which is disposed corresponding to one of the second pixel repetition units 122, so as to prevent the second anodes 1272, which are overlapped with the second sub-pixels 124 of one of the second pixel repetition units 122 correspondingly, from being irradiated by the infrared laser, which may damage the second anodes 1272, during patterning the second electrode layer 126 by the infrared laser.

Furthermore, the orthogonal projections of the second anodes 1272 provided correspondingly to one of the second pixel repetition units 122 projected on the substrate 11 is located within the orthogonal projection of one of the first light-shielding blocks 151 projected on the substrate 11. The minimum spacing between the orthogonal projection of the outer contour of one of the first light-shielding block 151 provided correspondingly to one of the second pixel repetition units 122 projected on the substrate 11 and the orthogonal projection of the outer contour of the second anodes 1272 provided correspondingly to one of the second pixel repetition units 122 projected on the substrate 11 is greater than or equal to 0.5 microns and less than or equal to 3 microns. As a result, in the condition of satisfying the processing precision, while one of the first light-shielding blocks 151 protect the second anodes 1272 of one of the second pixel repetition units 122, which are spaced apart with each other, the large area of the one of the first light-shielding layers 151 is avoided, which results in the large area of the patterned cathode 1261 and is disadvantageous to reducing the light transmittance. For example, the minimum spacing between the orthogonal projection of the outer contour of the second anodes 1272 provided correspondingly to one of the second pixel repetition units 122 projected on the substrate 11 and the orthogonal projection of the outer contour of one of the first light-shielding block 151 projected on the substrate 11 may be 1 micron, 1.5 microns, 2 microns, or 3 microns.

Furthermore, the outer contours of the first light-shielding blocks 151 are all serpentine to suppress the diffraction phenomenon in the second display area 10b.

As shown in FIG. 5, when the first pixel circuits 131 are disposed in the second display area 10b, the first pixel circuits 131 are overlapped with the first light-shielding blocks 151, such that the first light-shielding blocks 151 also protect the first pixel circuits 131.

As shown in FIG. 9, the second light-shielding block 152 is disposed around the light-shielding connecting lines 153 and the first light-shielding blocks 151. At least part of the second light-shielding block 152 is disposed in the edge of the second display area 10b, so that the second light-shielding block 152 blocks the infrared laser to prevent the infrared laser from irradiating the metal lines 133 located in the transition display area 10c and close to the second display area 10b and damaging the metal lines 133, during patterning the second electrode layer 126 by the infrared laser.

Specifically, the second light-shielding block 152 extends from the second display area 10b to the transition display area 10c, such that the second light-shielding block 152 blocks the infrared laser to prevent the infrared laser from irradiating the metal lines 133 and the thin film transistors of the first pixel circuits 131 close to the edge of the second display area 10b and damaging them, during patterning the second electrode layer 126 by the infrared laser. The second light-shielding block 152 located in the transition display area 10c can also be provided to the pixel circuit islands 131a to protect the pixel circuit islands 131a.

It should be noted that the infrared laser is a linear light source, and the energy of the infrared laser is shown by Gaussian distribution. The energy at the edge of the infrared laser is low and there is a risk that the cathode cannot be effectively removed. In order to ensure that the second electrode layer 126 in the second display area 10b close to the transition display area 10c can be completely removed, the high energy portion of the infrared laser is required to irradiate the second electrode layer 126 in the second display area 10b close to the transition display area 10c. However, at this moment, if there is no metal layer for blocking, the energy at the edge of the infrared laser may damage the metal lines and thin film transistors in the transition display area 10c close to the second display area 10b. Therefore, it is necessary to provide the second light-shielding block 152 in the transition display area 10c. Similarly, due to the influence of the energy at the edge of the infrared laser, the second light-shielding block 152 is required to extend from the transition display area 10c to the second display area 10b in order to avoid damage to the metal lines close to the second display area 10b during patterning the second electrode layer in the second display area 10b by the infrared laser. Moreover, since the second light-shielding block 152 extends to the second display area 10b, the second light-shielding block 152 blocks the infrared laser. As a result, a part of the non-patterned portion of the second electrode layer 126 is also located in the second display area 10b.

As shown in FIG. 4 and FIG. 9, the second light-shielding block 152 has a first edge 152a located in the second display area 10b, and the first edge 152a is smoothly circular. The distance H from the first edge 152a to the interface between the second display area 10b and the transition display area 10c is greater than or equal to 1 micron and less than 3 microns. As a result, in the condition of satisfying the processing precision, while the second light-shielding block 152 protect the metal lines 133 close to the second display area 10b, the large area of the one of the second light-shielding block 152 is avoided, which is disadvantageous to enhancing the light transmittance of the second display area 10b.

In the direction of the second display area 10b toward the transition display area 10c, the size of the portion of the second light-shielding block 152 in the first wiring area 10c1 is larger than the size of the portion of the second light-shielding block 152 in the second wiring area 10c2, so that the second light-shielding block 152 can effectively protect the metal lines 133 in the first wiring area 10c1.

Specifically, as shown in FIG. 9, the second light-shielding block 152 is annular, the second edge of the second light-shielding block 152 located in the transition display area 10c is elliptical, and the first edge 152a of the second light-shielding block 152 located in the second display area 10b is circular, so that the second light-shielding block 152 can match the arrangement of the metal lines 133, thereby effectively protecting the metal lines 133.

Figure 10:
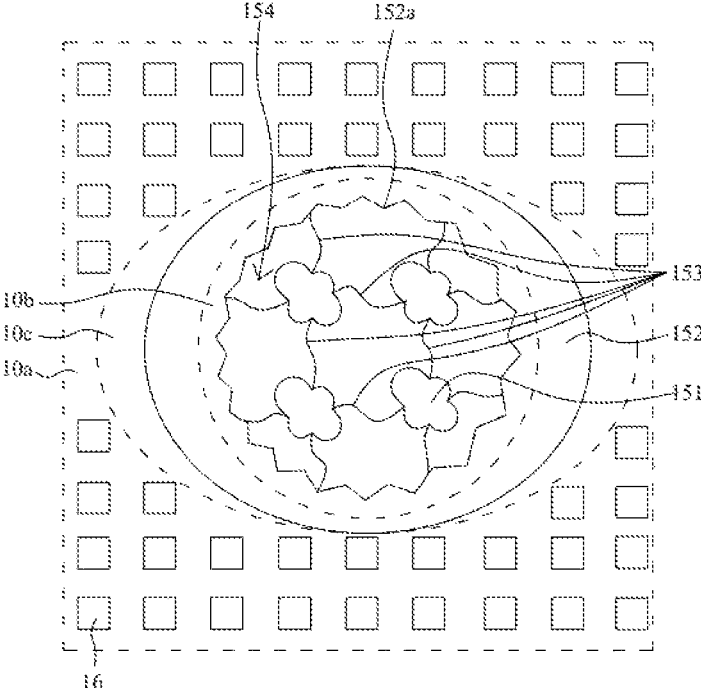
FIG. 10 is a first plan view of a metallic light-shielding layer and a plurality of shielding metal blocks of the display panel shown in FIG. 2.

Further, as shown in FIG. 10, the first edge 152a is serpentine to further suppress the diffraction of light caused by the first edge 152a of the second light-shielding block 152.

The width of the second light-shielding block 152 is greater than or equal to 10 microns to avoid damage to the metal lines 133 in the transition display area 10c by the infrared laser with a processing precision of 10 microns.

The light-shielding connecting lines 153 are located in the second display area 10b and overlapped with at least part of the transparent wires 141 in the second display area 10b. The light-shielding connecting lines 153 are overlapped with the patterned cathode 1261. During patterning the second electrode layer by the infrared laser, the light-shielding connecting lines 153 function as light-shielding to prevent the infrared laser from irradiating at least part of the transparent wires 141 and damaging at least part of the transparent wire 141s, so as to avoid affecting the display effect of the second sub-pixel 124 in the second display area 10b. Specifically, the light-shielding connecting lines 153 are overlapped with the transparent wires 141 located in the second display area 10b, respectively.

The orthographic projection of at least part of the transparent wires 141 located in the second display area 10b projected on the substrate 11 is located within the orthographic projections of the light-shielding connecting lines 153 projected on the substrate 11, and the difference between the width of the light-shielding connecting line 153 and the width of the transparent wire 141 is greater than or equal to 0.5 microns and less than or equal to 3 microns. As a result, in the condition of satisfying the processing precision, while the light-shielding connecting line 153 protects the transparent wire 141, the large width of the light-shielding connecting line 153 is voided, which is disadvantageous to reducing the light transmittance.

The light-shielding connecting line 153 connects adjacent two of the first light-shielding blocks 151, and at least one of the light transmitting openings 1262 is overlapped with the area surrounded by the adjacent two of the first light-shielding blocks 151 and the light-shielding connecting lines 153. Additionally or alternatively, the light-shielding connecting line 153 is connected with the adjacent first light-shielding block 151 and the second light-shielding block 152. At least one of the light-transmitting openings 1262 is overlapped with the area surrounded by the first light-shielding block 151, the second light-shielding block 152, and the light-shielding connecting lines 153, and the light-transmitting opening 1262 is not overlapped with the metallic light-shielding layer 15.

Specifically, a part of the light-shielding connecting lines 153 are connected with adjacent two of the first light-shielding blocks 151, and the area surrounded by the adjacent first light-shielding block 151 and the light-shielding connecting line 153 connecting the adjacent first light-shielding block 151 is provided with a hollow portion 154. Another part of the light-shielding connecting lines 153 connects the second light-shielding block 152 and a part of the first light-shielding blocks 151, and the area surrounded by the second light-shielding block 152, the part of the first light-shielding block 151, and a part of the light-shielding connecting lines 153 is also provided with a hollow portion 154.

Moreover, the hollow portions 154 are overlapped with the light-transmitting openings 1262, and a part of the light-transmitting openings 1262 is overlapped with the hollow portion 154 in the area surrounded by one of the second light-shielding block 152, a part of the first light-shielding block 151 adjacent to the second light-shielding block 152, and a part of the light-shielding connecting lines 153. Another part of the light-transmitting openings 1262 is overlapped with the hollow portion 154 in the area surrounded by the adjacent first light-shielding block 151 and a part of the light-shielding connecting lines connecting the adjacent first light-shielding block 151.

Furthermore, as shown in FIG. 10, the shapes of the light-shielding connecting lines 153 are serpentine, so as to further suppress the diffraction phenomenon in the second display area 10b and improve the display effect of the second display area 10b.

In this embodiment, the substrate 11 includes a first organic layer, an inorganic layer, and a second organic layer, which are stacked successively. The first organic layer and the second organic layer both are polyimide layers, and the inorganic layer is at least one of silicon nitride layer or silicon oxide layer. Because there are ions in the first organic layer and the second organic layer, the second pixel circuit 132 may generate current during operation. The current may polarize the ions, and the ion polarization may generate charges, which may affect the electrical performances of the thin film transistors in the second pixel circuit 132.

As shown in FIG. 4, FIG. 9, and FIG. 10, in this embodiment, the display panel further includes a plurality of shielding metal blocks 16. The shielding metal blocks 16 are disposed on the same layer as the metallic light-shielding layer 15 and correspondingly to the second pixel circuits 132. Each of the shielding metal block 16 is provided correspondingly to at least one thin film transistor in one of the second pixel circuits 132, and each of the shielding metal blocks 16 is connected to receive a fixed reference voltage, so as to improve the problem that the ion polarization in the substrate 11 affects the electrical performance of the thin film transistor in the second pixel circuit 132.

The thicknesses of the shielding metal blocks 16 are less than the thickness of the metallic light-shielding layer 15 to ensure the light-shielding effect of the metallic light-shielding layer 15.

Detailed above are a curved display panel and a curved display device disclosed in embodiments of the present disclosure. The principle and implementation manner of this application are described herein with reference to specific embodiments. The foregoing descriptions of the embodiments are merely used for better understanding of the method and core idea of this application. A person of ordinary skill in the art can make variations and modifications to the specific implementation manner and application scope according to the idea of this application. Therefore, content of the specification shall not be construed as a limitation to this application.

What is claimed is:

1. A display panel comprising a first display area, a second display area, and a transition display area between the first display area and the second display area, wherein the display panel comprises:

a substrate;

a light-emitting layer located on one side of the substrate, wherein the light-emitting layer comprises:

a plurality of first pixel repetition units located in the first display area, wherein one of the first pixel repetition units comprises a plurality of first sub-pixels; and a plurality of second pixel repetition units located in the second display area, wherein one of the second pixel repetition units comprises a plurality of second sub-pixels, wherein a number of the second sub-pixels in one of the second pixel repetition units is equal to a number of the first sub-pixels in one of the first pixel repetition units, and a minimum spacing between adjacent two of the second pixel repetition units is greater than a minimum spacing between adjacent two of the first pixel repetition units; and a metallic light-shielding layer disposed between the light-emitting layer and the substrate, wherein the metallic light-shielding layer comprises:

a plurality of first light-shielding blocks located in the second display area, wherein the first light-shielding blocks are at least partially overlapped with the second pixel repetition units, respectively;

a plurality of light-shielding connecting lines located in the second display area; and a second light-shielding block disposed around the plurality of the first light-shielding blocks and the plurality of the light-shielding connecting lines, and at least portion of the second light-shielding block is disposed at an edge of the second display area;

wherein one of the light-shielding connecting lines is connected with adjacent two of the first light-shielding blocks, and at least one of the light-transmitting openings is overlapped with an area surrounded by the adjacent two of the first light-shielding blocks and the one of the light-shielding connecting lines; and/or one of the light-shielding connecting lines is connected with the adjacent first and second light-shielding blocks, and at least one of the light-transmitting openings is overlapped with an area surrounded by the first light-shielding block, the second light-shielding block, and the one of the light-shielding connecting lines;

a first electrode layer disposed between the substrate and the light-emitting layer; and a second electrode layer disposed on one side of the light-emitting layer away from the substrate, wherein the second electrode layer comprises a plurality of light-transmitting openings defined in the second display area and located between adjacent second pixel repetition units.

2. The display panel according to claim 1, wherein the second light-shielding block extends from the second display area to the transition display area, and a distance from an edge of the second light-shielding block located in the second display area to an interface between the second display area and the transition display area is greater than or equal to 1 micron and less than 3 microns.

3. The display panel according to claim 1, wherein the display panel further comprises:

a pixel circuit layer located between the first electrode layer and the metallic light-shielding layer, wherein pixel circuit layer comprises:

a plurality of first pixel circuits located in the transition display area or the second display area, wherein one of the first pixel circuits is electrically connected with at least two of the second sub-pixels; and a plurality of metal lines located in the transition display area and disposed close to the second display area, wherein the plurality of metal lines are electrically connected with the first pixel circuits, and the second light-shielding block is overlapped with at least portion of the metal line.

4. The display panel according to claim 3, wherein a plurality of the first pixel circuits are located in the second display area, and the plurality of the first pixel circuits are overlapped with the plurality of the first light-shielding blocks.

5. The display panel according to claim 3, wherein the plurality of the first pixel circuits are disposed in the transition display area, and the display panel further comprises:

a transparent wire layer located between the pixel circuit layer and the first electrode layer, the transparent wire layer comprises a plurality of transparent wires electrically connecting the plurality of second sub-pixels and the plurality of first pixel circuits, at least portion of the transparent wires are located in the second display area and overlapped with at least portion of the light-shielding connecting lines.

6. The display panel according to claim 3, wherein the pixel circuit layer further comprises:

a plurality of second pixel circuits electrically connected with the plurality of first sub-pixels in the first pixel repetition unit; and a plurality of shielding metal blocks, wherein the plurality of shielding metal blocks are disposed on the same layer as the metallic light-shielding layer and overlapped with the plurality of second pixel circuits, and thicknesses of the plurality of shielding metal blocks are less than a thickness of the metallic light-shielding layer.

7. The display panel according to claim 1, wherein the first electrode layer comprises a plurality of anodes disposed corresponding to one of the second pixel repetition units and overlapped with the plurality of second sub-pixels in the one of the second pixel repetition units, and one of the first light-shielding blocks disposed corresponding to the one of the second pixel repetition units is overlapped with the plurality of anodes disposed corresponding to the one of the second pixel repetition unit.

8. The display panel according to claim 7, wherein orthogonal projections of the plurality of anodes disposed corresponding to the one of the second pixel repetition units projected on the substrate is located within an orthogonal projection of the one of the first light-shielding blocks on the substrate, and a minimum spacing between an orthogonal projection of an outer contour of the one of the first light-shielding blocks disposed corresponding to the one of the second pixel repetition units projected on the substrate and orthogonal projection of outer contours of the plurality of anodes disposed corresponding to the one of the second pixel repetition units projected on the substrate is greater than or equal to 0.5 microns and less than or equal to 3 microns.

9. The display panel according to claim 1, wherein a spacing between adjacent two of the first sub-pixels in one of the first pixel repetition unit is greater than a spacing between adjacent two of the second sub-pixels in one of the second pixel repetition units.

10. A display device comprising a display panel and a photosensitive component, wherein the display panel comprising a first display area, a second display area, and a transition display area between the first display area and the second display area, the photosensitive component is disposed corresponding to the second display area, and the display panel comprises:

a substrate;

a light-emitting layer located on one side of the substrate, wherein the light-emitting layer comprises:

a plurality of first pixel repetition units located in the first display area, wherein one of the first pixel repetition units comprises a plurality of first sub-pixels; and a plurality of second pixel repetition units located in the second display area, wherein one of the second pixel repetition units comprises a plurality of second sub-pixels, wherein a number of the second sub-pixels in one of the second pixel repetition units is equal to a number of the first sub-pixels in one of the first pixel repetition units, and a minimum spacing between adjacent two of the second pixel repetition units is greater than a minimum spacing between adjacent two of the first pixel repetition units; and a metallic light-shielding layer disposed between the light-emitting layer and the substrate, wherein the metallic light-shielding layer comprises:

a plurality of first light-shielding blocks located in the second display area, wherein the first light-shielding blocks are at least partially overlapped with the second pixel repetition units, respectively;

a plurality of light-shielding connecting lines located in the second display area; and a second light-shielding block disposed around the plurality of the first light-shielding blocks and the plurality of the light-shielding connecting lines, and at least portion of the second light-shielding block is disposed at an edge of the second display area;

wherein one of the light-shielding connecting lines is connected with adjacent two of the first light-shielding blocks, and at least one of the light-transmitting openings is overlapped with an area surrounded by the adjacent two of the first light-shielding blocks and the one of the light-shielding connecting lines; and/or one of the light-shielding connecting lines is connected with the adjacent first and second light-shielding blocks, and at least one of the light-transmitting openings is overlapped with an area surrounded by the first light-shielding block, the second light-shielding block, and the one of the light-shielding connecting lines;

a first electrode layer disposed between the substrate and the light-emitting layer; and a second electrode layer disposed on one side of the light-emitting layer away from the substrate, wherein the second electrode layer comprises a plurality of light-transmitting openings defined in the second display area and located between adjacent second pixel repetition units.

11. The display device according to claim 10, wherein the second light-shielding block extends from the second display area to the transition display area, and a distance from an edge of the second light-shielding block located in the second display area to an interface between the second display area and the transition display area is greater than or equal to 1 micron and less than 3 microns.

12. The display device according to claim 10, wherein the display panel further comprises:

a pixel circuit layer located between the first electrode layer and the metallic light-shielding layer, wherein pixel circuit layer comprises:

a plurality of first pixel circuits located in the transition display area or the second display area, wherein one of the first pixel circuits is electrically connected with at least two of the second sub-pixels; and a plurality of metal lines located in the transition display area and disposed close to the second display area, wherein the plurality of metal lines are electrically connected with the first pixel circuits, and the second light-shielding block is overlapped with at least portion of the metal line.

13. The display device according to claim 12, wherein a plurality of the first pixel circuits are located in the second display area, and the plurality of the first pixel circuits are overlapped with the plurality of the first light-shielding blocks.

14. The display device according to claim 12, wherein the plurality of the first pixel circuits are disposed in the transition display area, and the display panel further comprises:

a transparent wire layer located between the pixel circuit layer and the first electrode layer, the transparent wire layer comprises a plurality of transparent wires electrically connecting the plurality of second sub-pixels and the plurality of first pixel circuits, at least portion of the transparent wires are located in the second display area and overlapped with at least portion of the light-shielding connecting lines.

15. The display device according to claim 12, wherein the pixel circuit layer further comprises:

a plurality of second pixel circuits electrically connected with the plurality of first sub-pixels in the first pixel repetition unit; and a plurality of shielding metal blocks, wherein the plurality of shielding metal blocks are disposed on the same layer as the metallic light-shielding layer and overlapped with the plurality of second pixel circuits, and thicknesses of the plurality of shielding metal blocks are less than a thickness of the metallic light-shielding layer.

16. The display device according to claim 10, wherein a spacing between adjacent two of the first sub-pixels in one of the first pixel repetition unit is greater than a spacing between adjacent two of the second sub-pixels in one of the second pixel repetition units.

* * * * *